United States Patent
Masuda et al.

(10) Patent No.: US 9,155,231 B2
(45) Date of Patent: Oct. 6, 2015

(54) MOTOR-DRIVE UNIT HAVING HEAT RADIATOR

(71) Applicant: FANUC CORPORATION, Yamanashi (JP)

(72) Inventors: Naoki Masuda, Yamanashi (JP); Kiichi Inaba, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 71 days.

(21) Appl. No.: 14/154,311

(22) Filed: Jan. 14, 2014

(65) Prior Publication Data

US 2014/0198455 A1    Jul. 17, 2014

(30) Foreign Application Priority Data

Jan. 15, 2013 (JP) ................................ 2013-004457

(51) Int. Cl.
*H05K 7/20* (2006.01)
*G06F 1/20* (2006.01)
(Continued)

(52) U.S. Cl.
CPC *H05K 7/209* (2013.01); *G06F 1/20* (2013.01); *H02M 7/00* (2013.01); *H05K 7/2089* (2013.01); *H05K 7/20845* (2013.01)

(58) Field of Classification Search
CPC ..... H05K 7/20; H05K 7/209; H05K 7/20845; H05K 7/2089; H05K 7/20918; H05K 7/14; G06F 1/20; H01L 23/10; H01L 23/34; H01L 25/162; H02M 7/00; H02M 1/00; H02M 1/12; F28D 2012/0073; H02P 6/14
USPC ........................ 361/679.46–679.54, 704–712, 361/715–723, 732, 756, 760; 165/80.2, 165/80.3, 80.4, 104.33, 185; 257/722–726; 174/15.1, 16.3, 252; 363/89, 95–98, 363/131, 132, 123, 141, 144, 321; 310/67 R, 310/68 R, 89; 318/781, 784, 795
See application file for complete search history.

(56) References Cited

U.S. PATENT DOCUMENTS 5,586,004 A * 12/1996 Green et al. .................. 361/699
5,930,112 A * 7/1999 Babinski et al. .............. 361/695
(Continued)

FOREIGN PATENT DOCUMENTS

| JP | 57118656 A | 7/1982 |
|---|---|---|
| JP | 03096261 A | 4/1991 |

(Continued)

OTHER PUBLICATIONS

English Abstract for Japanese Publication No. 57-118656 published Jul. 23, 1982, 1 page.

(Continued)

*Primary Examiner* — Michail V Datskovskiy
(74) *Attorney, Agent, or Firm* — Fredrikson & Byron, P.A.

(57) ABSTRACT

A compact motor-drive unit wherein each component can be stably fixed to the unit. A motor-drive unit has a plurality of substrates each having a circuit for driving a motor; semiconductor devices mounted on the respective substrates; at least one smoothing capacitor mounted on at least one of the substrates; and a heat radiator having a heat-transferring surface adjacent to the semiconductors. The smoothing capacitor is positioned within a swept area formed by moving the first substrate arranged generally parallel to a base surface, in a counter-front direction, so that the smoothing capacitor is separated from the first substrate.

7 Claims, 5 Drawing Sheets

(51) Int. Cl.
*H02M 7/00* (2006.01)
*H01L 23/34* (2006.01)

(56) References Cited

U.S. PATENT DOCUMENTS

| | | | | |
|---|---|---|---|---|
| 6,091,604 A | * | 7/2000 | Plougsgaard et al. | 361/707 |
| 6,320,776 B1 | * | 11/2001 | Kajiura et al. | 363/141 |
| 6,493,227 B2 | * | 12/2002 | Nielsen et al. | 361/703 |
| 6,580,608 B1 | * | 6/2003 | Searls et al. | 361/690 |
| 6,900,562 B2 | * | 5/2005 | Derksen | 310/68 R |
| 6,984,887 B2 | * | 1/2006 | Umezu et al. | 257/706 |
| 7,336,495 B2 | * | 2/2008 | Maeda | 361/717 |
| 7,375,287 B2 | * | 5/2008 | Rathmann | 174/260 |
| 7,471,534 B2 | * | 12/2008 | Andersson et al. | 363/141 |
| 7,817,421 B2 | * | 10/2010 | Nagatomo et al. | 361/697 |
| 7,961,487 B2 | * | 6/2011 | Seto et al. | 363/132 |
| 8,004,836 B2 | * | 8/2011 | Kauranen et al. | 361/690 |
| 8,031,478 B2 | * | 10/2011 | Yamabuchi et al. | 361/775 |
| 8,054,641 B2 | * | 11/2011 | Onishi et al. | 361/752 |
| 8,159,820 B2 | * | 4/2012 | Ibori et al. | 361/695 |
| 8,310,830 B2 | * | 11/2012 | Zheng et al. | 361/697 |
| 8,363,408 B2 | * | 1/2013 | Zheng | 361/713 |
| 8,385,078 B2 | * | 2/2013 | Ibori et al. | 361/742 |
| 8,422,230 B2 | * | 4/2013 | Aiba et al. | 361/704 |
| 8,599,554 B2 | * | 12/2013 | Harada et al. | 361/688 |
| 8,787,018 B2 | * | 7/2014 | Nagano et al. | 361/690 |
| 2008/0266811 A1 | | 10/2008 | Yamada et al. | |
| 2012/0188712 A1 | * | 7/2012 | Ishibashi et al. | 361/688 |

FOREIGN PATENT DOCUMENTS

| | | |
|---|---|---|
| JP | 2000049480 A | 2/2000 |
| JP | 2002185172 A | 6/2002 |
| JP | 2002246779 A | 8/2002 |
| JP | 2004207384 | 7/2004 |
| JP | 2009212311 | 9/2009 |
| JP | 2010187504 A | 8/2010 |
| WO | 2007080748 A1 | 7/2007 |

OTHER PUBLICATIONS

English Abstract for Japanese Publication No. 03-096261 published Apr. 22, 1991, 1 page.
English Machine Translation for Japanese Publication No. 2000-049480 published Feb. 18, 2000, 12 pages.
English Machine Translation for Japanese Publication No. 2002-185172 published Jun. 28, 2002, 14 pages.

* cited by examiner

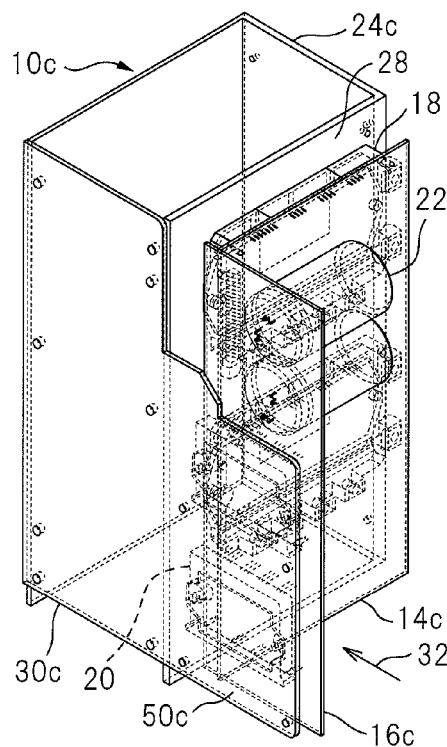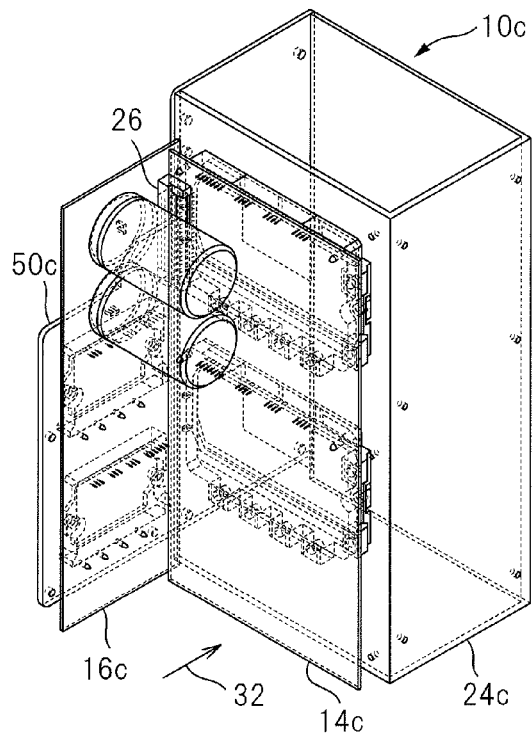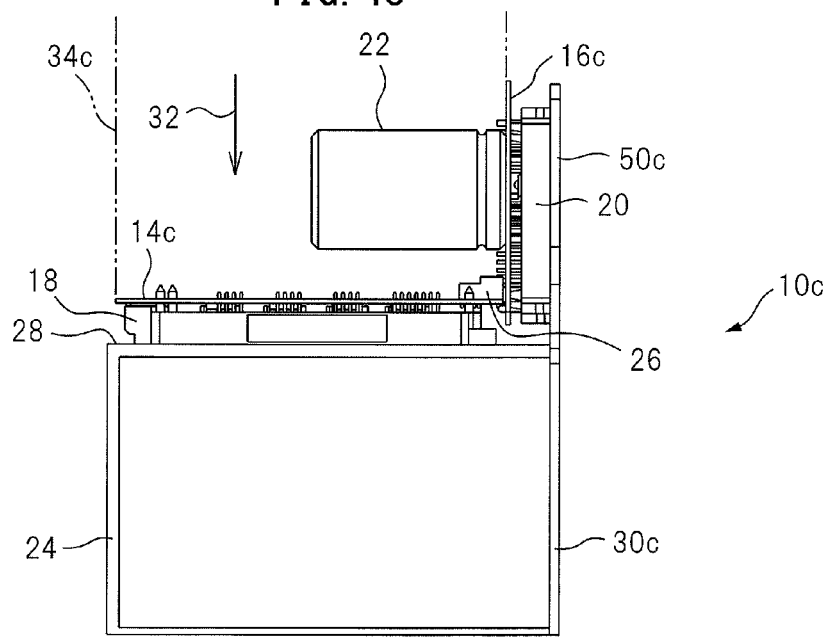

MOTOR-DRIVE UNIT HAVING HEAT RADIATOR

BACKGROUND OF THE INVENTION

1. Field of the Invention

The present invention relates to a motor-drive unit having a heat radiator for releasing heat from a semiconductor device mounted on a substrate.

2. Description of the Related Art

Generally, in a case that a circuit of a motor-drive unit having a heat radiator is designed by using one printed board, an area of the motor-drive unit viewed in a front direction (or a direction perpendicular to the printed board) is approximately equal to the printed board when the printed board is attached to the motor-drive unit. Therefore, depending on the area of the printed board, the motor-drive unit (or the heat radiator) is enlarged. For example, Japanese Unexamined Patent Publication (Kokai) No. 2002-246779 discloses a heat sink to which two circuit boards orthogonal to each other are attached, in order to reduce a volume occupied by the entire heat sink.

Further, as another example for downsizing a heat radiator, Japanese Unexamined Patent Publication (Kokai) No. 2010-187504 discloses an inverter unit wherein a capacitor board on which a capacitor is mounted and a printed board on which a semiconductor device is mounted are attached to different planes of a heat radiator, in order to thermally separate the capacitor board from the printed board.

In the heat sink as described in Japanese Unexamined Patent Publication (Kokai) No. 2002-246779, the circuit board is fixed to the heat sink at a single site thereof, or the circuit board is configured as a cantilever structure. Therefore, the fixing of the circuit board may be unstable. Further, since each circuit board is independent from each other, the area of the board in the front direction may be increased depending on a design of the circuit, whereby the width of the board in the front direction may be increased.

On the other hand, in Japanese Unexamined Patent Publication (Kokai) No. 2010-187504, the capacitor board is positioned at a lateral side of the heat sink. However, since the smoothing capacitor has a certain height in order to have a predetermined capacitance, even when the capacitor board is positioned at the lateral side of the heat sink, the width of the board in the front direction cannot be significantly decreased.

SUMMARY OF THE INVENTION

The object of the present invention is to provide a compact motor-drive unit wherein each component can be stably fixed to the unit.

The present invention provides a motor-drive unit comprising: a first substrate and a second substrate wherein a circuit for driving a motor is divided and divided sections of the circuit are formed on the first and second substrates; a connecting part which connects the first and second substrates so that the first and second substrates intersect with each other; a semiconductor device mounted on each of the first and second substrates; a heat radiator having a first heat-transferring surface adjacent to the semiconductor device mounted on the first substrate; and a capacitor positioned within a swept area formed by moving the first substrate in a direction perpendicular to the first heat-transferring surface, the capacitor being separated from the first substrate.

In a preferred embodiment, the capacitor is a screw-fastening-type capacitor which is fastened to a first conductive arm member extending from the first substrate by means of a screw.

In a preferred embodiment, the capacitor is mounted on a capacitor substrate attached to a second conductive arm member extending from the first substrate.

In a preferred embodiment, the capacitor is mounted on an extended portion formed by extending the second substrate in a direction perpendicular to the first substrate.

In a preferred embodiment, a part of the heat radiator has a projecting portion extending in a direction perpendicular to the first heat-transferring surface, and the semiconductor device is attached to the projecting portion.

In a preferred embodiment, semiconductor devices are positioned adjacent to at least two heat-transferring surfaces having different surface directions. In this case, the heat radiator may have a plurality of heat-releasing fins extending parallel to each other at an inclined angle relative to the first heat-transferring surface. Otherwise, the heat radiator may have a plurality of heat-releasing fins including fins extending perpendicular to one of the at least two heat-transferring surfaces and including fins extending perpendicular to the other of the at least two heat-transferring surfaces.

BRIEF DESCRIPTION OF THE DRAWINGS

The above and other objects, features and advantages of the present invention will be made more apparent by the following description of the preferred embodiments thereof, with reference to the accompanying drawings, wherein:

FIG. 1b is a perspective view of the motor-drive unit of the first embodiment viewed in a different direction from FIG. 1a;

FIG. 4a is a perspective view showing a schematic configuration of a motor-drive unit according to a fourth embodiment of the invention;

FIG. 4b is a perspective view of the motor-drive unit of the fourth embodiment viewed in a different direction from FIG. 4a;

FIG. 4c is a view of the motor drive-unit of the fourth embodiment viewed from the above;

DETAILED DESCRIPTION

Figure 1A:
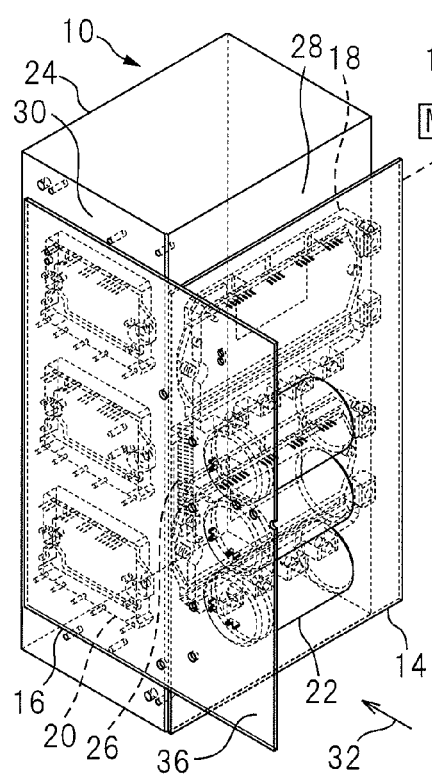
FIG. 1a is a perspective view showing a schematic configuration of a motor-drive unit according to a first embodiment of the invention.
Figure 1B:
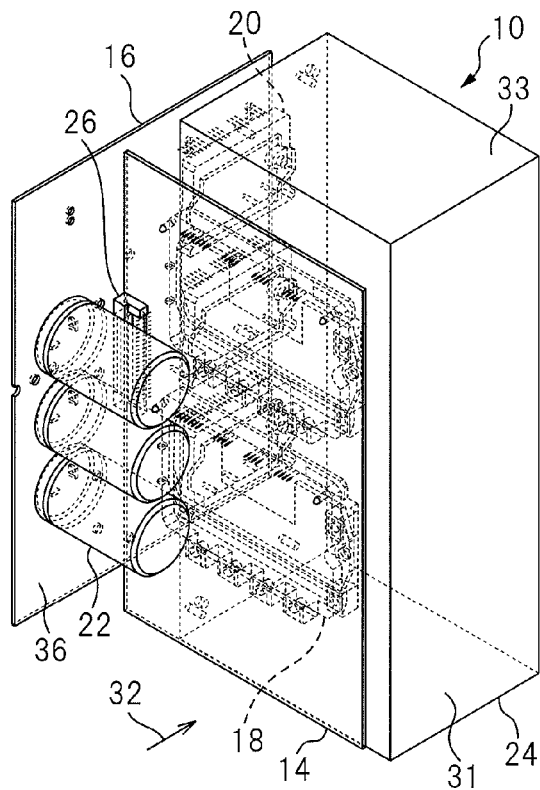
Figure 1C:
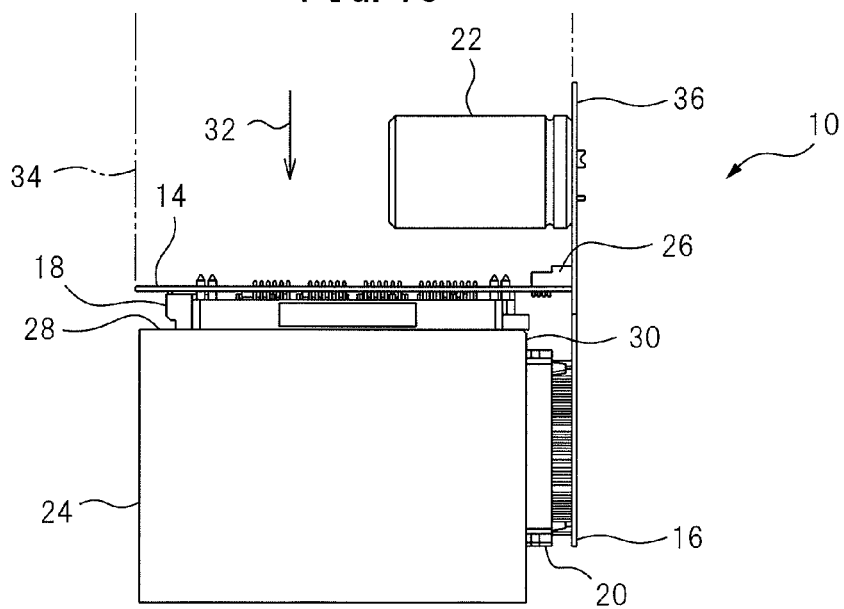
FIG. 1c is a view of the motor-drive unit of the first embodiment viewed from the above.

FIGS. 1a to 1c show a basic configuration of a motor-drive unit 10 according to a first embodiment of the present invention. Motor-drive unit 10 has a plurality of (two in the illustrated embodiment) substrates 14 and 16 each having a circuit for driving a motor 12 schematically shown in FIG. 1a; semiconductor devices 18 and 20 mounted on substrates 14 and 16, respectively; at least one (three in the illustrated embodiment) smoothing capacitor 22 mounted on at least one of substrates 14 and 16; and a heat radiator 24 having a heat-transferring surface adjacent to semiconductors 18 and 20. The term "semiconductor device" herein includes a transistor, a power device, a diode, an integrated circuit (IC) and a resistance, etc., whereas the term "semiconductor device" does not include a capacitor such as smoothing capacitor 22.

In the first embodiment, substrates 14 and 16 are printed board, and a circuit required to drive motor 12 is divided and formed on each substrate by printing a copper foil, etc. Printed boards 14 and 16 are not parallel to each other, and are connected to each other by means of a connecting part 26 so as to intersect with (or be orthogonal to) each other. Connecting part 26 may have any structure as long as it fixes the positional relationship (the orthogonal relationship in the illustrated embodiment) between the two printed boards and electrically connects them each other. For example, connecting part 26 may be a conventional substrate connector or terminal block.

At least one semiconductor device 18 is positioned between printed board 14 and heat radiator 24, and at least one semiconductor device 20 is positioned between printed board 16 and heat radiator 24. In the illustrated embodiment, two first semiconductors 18 are positioned between first printed board 14 and a first heat transferring surface 28 of heat radiator 24, and three second semiconductors 20 are positioned between second printed board 16 and a second heat transferring surface 30 of heat radiator 24. Surface directions of first heat-transferring surface 28 and second heat-transferring surface 30 are different from each other, i.e., they are not parallel to each other (orthogonal to each other in the illustrated embodiment). Each semiconductor device contacts first heat-transferring surface 28 or second heat-transferring surface 30 of heat radiator 24, whereby heat generated from each semiconductor device is transferred to heat radiator 24. In the first embodiment, each semiconductor device is fixed to heat radiator 24 by means of a screw, etc., as shown in FIG. 1c, whereby the positional relationship between heat radiator 24 and printed boards 14, 16 is determined. However, printed board 14 or 16 may be directly fixed to heat radiator 24 by means of a screw, etc.

In the illustrated embodiment, heat radiator 24 has a generally cuboid shape having a heat sink structure with heat-releasing fins therein (see FIGS. 5 and 6 described below). Printed boards 14 and 16 are positioned parallel to heat-transferring surfaces 28 and 30 of heat radiator 24, respectively. In the present invention, one of the heat-transferring surfaces (heat-transferring surface 28 in the illustrated embodiment) contacting the semiconductor device is also referred to as a "base surface," and a direction (indicated by an arrow 32) toward base surface 28 and perpendicular to the base surface is also referred to as a "front direction."

As shown in FIG. 1c, smoothing capacitors 22 are positioned within a swept area 34 formed by moving first printed board 14 arranged generally parallel to base surface 28, in a counter-front direction (or a direction perpendicular to base surface 28 and away from the heat radiator). Further, smoothing capacitors 22 are not directly attached to first printed board 14, are attached to a portion of the motor-drive unit other than first printed board 14 so that the smoothing capacitors are separated from first printed board 14. In the first embodiment, smoothing capacitors 22 are mounted on an extended portion 36 which is formed by extending second printed board 16 orthogonal to first printed board 14 in the counter-front direction.

The entire motor-drive unit 10 is desired to be compact, whereas it is assumed that swept area 34 is not spatially restricted in view of the install position of the motor-drive unit. Therefore, there is no problem when relatively large smoothing capacitor 22 is positioned within swept area 34. In the present invention, by positioning at least two printed boards close to the heat-transferring surfaces of heat radiator 24, the size of each printed board can be reduced, whereby the size of base surface 28 of heat radiator 24 can also be reduced. Further, since the smoothing capacitor is separated from first printed board 14, semiconductor device 18 can be positioned within a backward projected space of smoothing capacitor 22 when viewed in the front direction, whereby the unit can also be compact. In addition, since the printed boards are connected to each other by means of the connecting part as well as fixed to the heat radiator via the semiconductor device, each printed board can be stably fixed.

Figure 2:
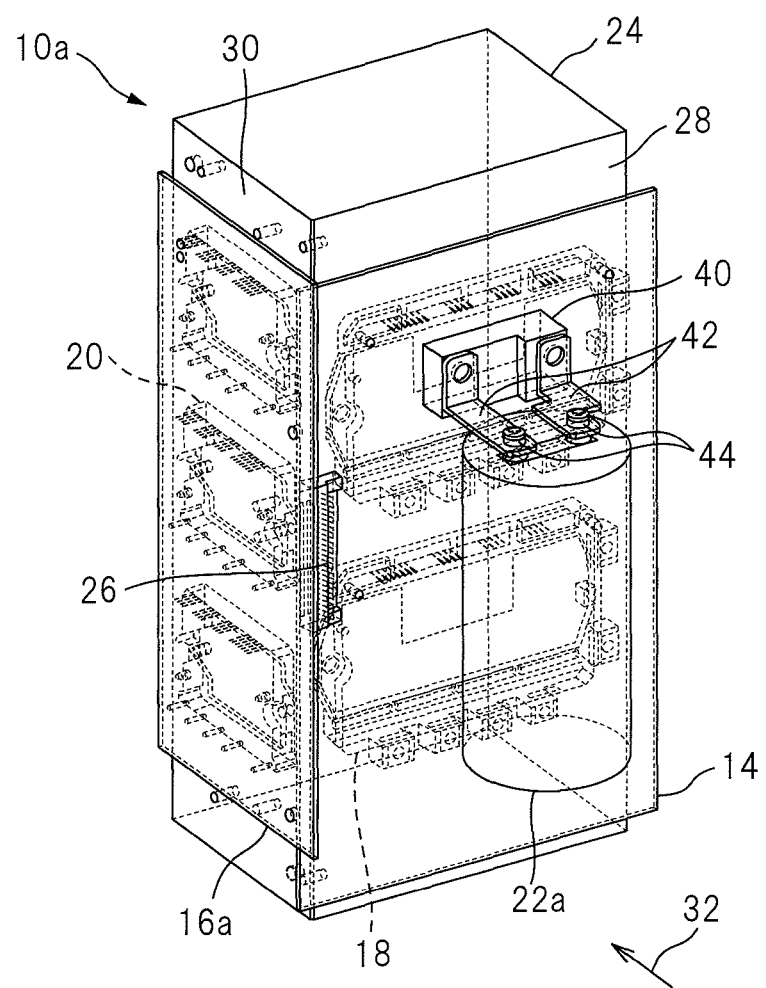
FIG. 2 is a perspective view showing a schematic configuration of a motor-drive unit according to a second embodiment of the invention.

FIG. 2 shows a basic configuration of a motor-drive unit 10a according to a second embodiment of the present invention. The second embodiment is different from the first embodiment in the attachment manner of the smoothing capacitor. Therefore, each component in the second embodiment corresponding to the component in the first embodiment is provided with the same reference numeral as the first embodiment, and a detailed explanation thereof is omitted.

As shown in FIG. 2, smoothing capacitor 22a is a screw-fastening-type capacitor, which is not mounted on the substrate or printed board as shown in FIGS. 1a to 1c. In detail, a terminal block 40 is mounted on first printed board 14, a conductive (for example, metallic) first arm member 42 extends from terminal block 40 (in the counter-front direction), and smoothing capacitor 22a is fastened to first arm member 42 by means of a screw 44. By virtue of such a configuration, smoothing capacitor 22a can be positioned within a swept area similar to swept area 34 as shown in FIG. 1c, and is separated from first printed board 14. Therefore, semiconductor device 18 can be positioned within a backward projected space of smoothing capacitor 22a when viewed in the front direction. In this case, it is not necessary to provide extended portion 36 to second printed board 16a, unlike second printed board 16 in the first embodiment.

Figure 3:
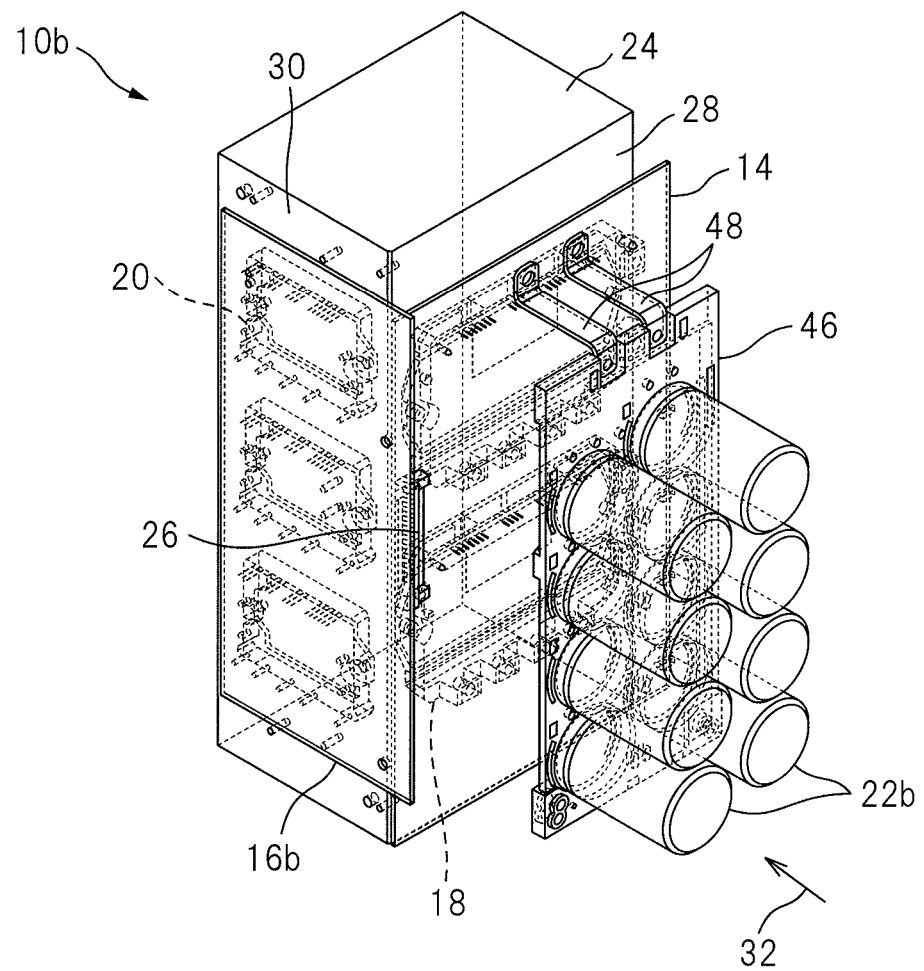
FIG. 3 is a perspective view showing a schematic configuration of a motor-drive unit according to a third embodiment of the invention.

FIG. 3 shows a basic configuration of a motor-drive unit 10b according to a third embodiment of the present invention. The third embodiment is different from the first embodiment in the attachment manner of the smoothing capacitor. Therefore, each component in the third embodiment corresponding to the component in the first embodiment is provided with the same reference numeral as the first embodiment, and a detailed explanation thereof is omitted.

As shown in FIG. 3, smoothing capacitor 22b is not mounted on the substrate or printed board as shown in FIGS. 1a to 1c, but mounted on a separate capacitor substrate 46. In detail, a conductive (for example, metallic) second arm member 48 extends from first printed board 14 (in the counter-front direction), capacitor substrate 46 is attached to second arm member 48, and at least one (eight in the illustrated embodiment) capacitors 22b are directly attached (or mounted) to capacitor board 46. By virtue of such a configuration, smoothing capacitors 22b can also be positioned within a swept area similar to swept area 34 as shown in FIG. 1c, and is separated from first printed board 14. Therefore, semiconductor device 18 can be positioned within a backward projected space of smoothing capacitor 22b when viewed in the front direction. Also in this case, it is not necessary to provide extended portion 36 to second printed board 16b, unlike second printed board 16 in the first embodiment.

In the embodiments of FIGS. 1a to 3, base surface 28 and second surface 30 orthogonal to the base surface of heat radiator 24 are used as the heat-transferring surfaces. However, a surface 31 opposed to second surface 30, and/or an upper surface 33 of the heat radiator (see FIG. 1b) may also be used as the heat-transferring surface. In this case, printed boards (not shown), to which semiconductors adjacent to surfaces 31 and 33 are respectively mounted, may be arranged, and these printed board are connected to the first or second substrate by means of connecting part 26, etc.

FIGS. 4a to 4c show a basic configuration of a motor-drive unit 10c according to a fourth embodiment of the present invention. The fourth embodiment is different from the first embodiment in a structure regarding the heat radiator and the second printed board. Therefore, each component in the fourth embodiment corresponding to the component in the first embodiment is provided with the same reference numeral as the first embodiment, and a detailed explanation thereof is omitted.

As shown in FIG. 4a, a part of heat radiator 24c (a side wall 30c in the illustrated embodiment) has a projecting portion 50c extending in a direction generally perpendicular to base surface 28 (or the counter-front direction), and semiconductor device 20 is positioned between projecting portion 50c and second printed board 16c. The fourth embodiment is similar to the first embodiment in that smoothing capacitor 22 is mounted on second printed board 16c. However, in the fourth embodiment, second printed board 16c is positioned within a forward projected space of base surface 28 of heat radiator 24c viewed in front direction 32, whereby the motor-drive unit can be more compact than the first embodiment in relation to a width direction (left-and-right directions in FIG. 4c) of the unit.

In the fourth embodiment, similarly to the first embodiment, smoothing capacitors 22 are positioned within a swept area 34c formed by moving first printed board 14c arranged generally parallel to base surface 28, in a counter-front direction (or a direction perpendicular to base surface 28 and away from the heat radiator). Further, smoothing capacitors 22 are not directly attached to first printed board 14c, so that the smoothing capacitors are separated from first printed board 14c. Also in the fourth embodiment, semiconductor device 18 can be positioned within the backward projected space, similarly to the first embodiment.

Figure 5:
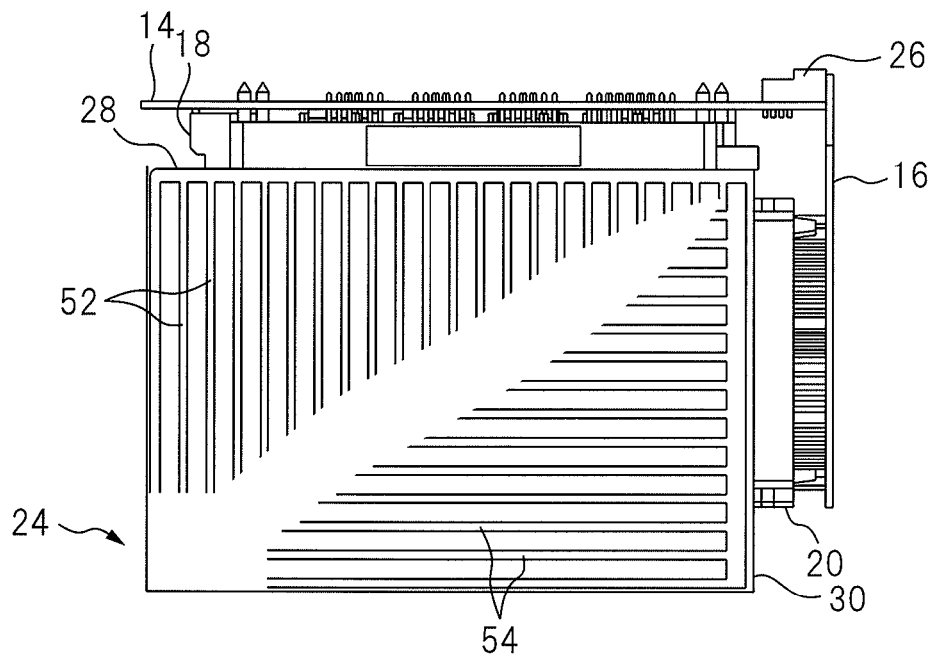
FIG. 5 is a view showing a configuration example of a heat radiator of the motor-drive unit.
Figure 6:
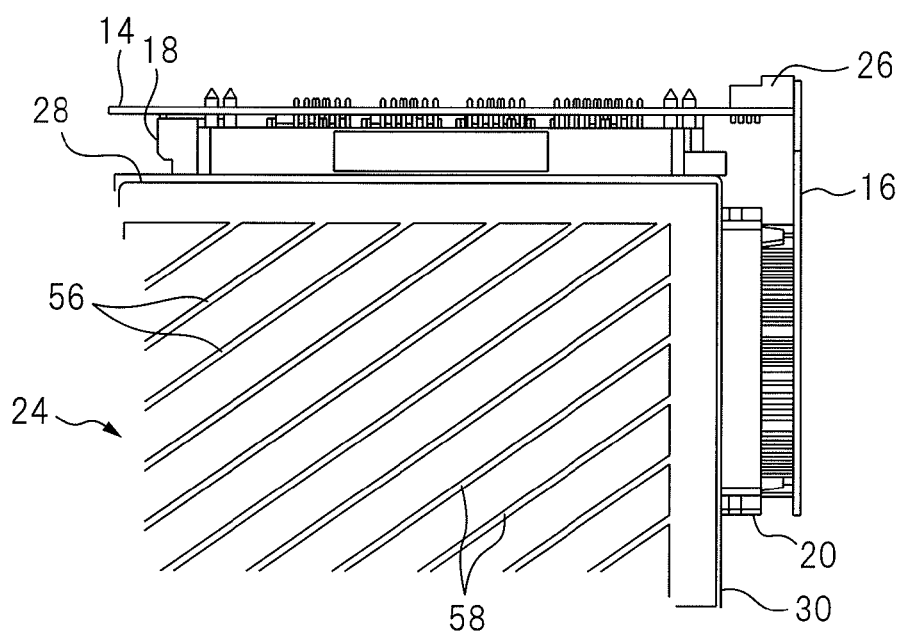
FIG. 6 is a view showing another configuration example of a heat radiator of the motor-drive unit.

FIGS. 5 and 6 explain a preferable shape of heat-releasing fins formed within the heat radiator, when two surfaces 28 and 30 are used as heat-transferring surfaces of heat radiator 24, as in the first, second and third embodiments as shown in FIGS. 1a to 3. In FIGS. 5 and 6, the smoothing capacitors are not shown.

First, in the example of FIG. 5, in relation to each of two heat-transferring surfaces 28 and 30 of heat radiator 24, a plurality of fins are arranged so as to extend perpendicular to the corresponding heat-transferring surface and away from the semiconductor device. Concretely, heat radiator 24 has first heat-releasing fins 52 extending from a back side of first heat-transferring surface 28 so that first fins 52 extend in a direction perpendicular to first heat-transferring surface 28 and toward the opposite side of a side where semiconductor device 18 is positioned, and second heat-releasing fins 54 extending from a back side of second heat-transferring surface 30 so that second fins 54 extend in a direction perpendicular to second heat-transferring surface 30 and toward the opposite side of a side where semiconductor device 20 is positioned.

In the example of FIG. 5, heat can be effectively released from each semiconductor device. When three or more heat-transferring surfaces having different surface directions are used, each heat-transferring surface may also have heat-releasing fins extending from the corresponding surface at a right angle.

Next, in the example of FIG. 6, a plurality of heat-releasing fins, which extend at an inclined angle relative to two heat-transferring surfaces 28 and 30 of heat radiator 24 and away from the semiconductor device, are arranged. Concretely, heat radiator 24 has first heat-releasing fins 56 extending from a back side of first heat-transferring surface 28 so that first fins 56 extend in an angle of more than zero and less than 90 degrees (preferably, 30 to 60 degrees, or more preferably, 40 to 50 degrees) relative to first heat-transferring surface 28 and toward the opposite side of a side where semiconductor device 18 is positioned, and second heat-releasing fins 58 extending from a back side of second heat-transferring surface 30 so that second fins 58 extend in an angle of more than zero and less than 90 degrees (preferably, 60 to 30 degrees, or more preferably, 50 to 40 degrees) relative to second heat-transferring surface 30 and toward the opposite side of a side where semiconductor device 20 is positioned. Further, as shown in FIG. 6, the extending angle of first heat-releasing fins 56 and the extending angle of second heat-releasing fins 58 may be the same (i.e., the heat-releasing fins are parallel to each other).

In the example of FIG. 6, since all of the heat-releasing fins extend in the same direction, the heat radiator may be more simplified and manufactured at lower cost than the example of FIG. 5, while obtaining a certain degree of heat radiating effect.

According to the present invention, a circuit for driving a motor is divided into a plurality of substrates, the circuit may be attached to a heat radiator without increasing an area (or horizontal and vertical sizes) of a base surface of the radiator view in the front direction thereof, even when the circuit before being divided is relatively large. Further, a capacitor (or a relatively large electronic component) can be positioned within a predetermined space, whereby the motor-drive unit may be compact. In addition, since each substrate can be fixed to the unit by means of a semiconductor device and a connecting part (i.e., at two or more sections) so as to extend parallel to a heat-transferring surface of the heat radiator, the substrate may be more stably fixed than the prior art.

As a concrete attachment manner of the capacitor, the capacitor may be fastened to an arm member extending from the first substrate by means of a screw; the capacitor may be mounted on a capacitor board attached to an arm member; or the capacitor may be mounted on an extended portion formed by extending a second substrate in a direction perpendicular to the first substrate. In any case, a complicated structure is not necessary.

When two heat-transferring surfaces of the heat radiator have semiconductor devices adjacent thereto, heat can be effectively released from each heat-transferring surface, by using fins extending parallel to each other at an inclined angle relative to the first heat-transferring surface, or by using fins extending perpendicular to the respective heat-transferring surfaces.

While the invention has been described with reference to specific embodiments chosen for the purpose of illustration, it should be apparent that numerous modifications could be made thereto, by a person skilled in the art, without departing from the basic concept and scope of the invention.

The invention claimed is:
1. A motor-drive unit comprising:
 a first substrate and a second substrate wherein a circuit for driving a motor is divided and divided sections of the circuit are formed on the first and second substrates;

a connecting part which connects the first and second substrates so that the first and second substrates intersect with each other;
a semiconductor device mounted on each of the first and second substrates;
a heat radiator having a first heat-transferring surface adjacent to the semiconductor device mounted on the first substrate and a second heat-transferring surface having a surface direction different from a surface direction of the first heat-transferring surface; and
a capacitor positioned within a swept area formed by moving the first substrate in a direction perpendicular to the first heat-transferring surface, the capacitor being separated from the first substrate, wherein the semiconductor devices are positioned adjacent to at least the first and second heat transferring surfaces, respectively.

2. A motor-drive unit comprising:
a first substrate and a second substrate wherein a circuit for driving a motor is divided and divided sections of the circuit are formed on the first and second substrates;
a connecting part which connects the first and second substrates so that the first and second substrates intersect with each other;
a semiconductor device mounted on each of the first and second substrates;
a heat radiator having a first heat-transferring surface adjacent to the semiconductor device mounted on the first substrate and a second heat-transferring surface having a surface direction different from a surface direction of the first heat-transferring surface; and
a capacitor, wherein the capacitor is a screw-fastening-type capacitor which is fastened to a first conductive arm member extending from the first substrate by means of a screw.

3. A motor-drive unit comprising:
a first substrate and a second substrate wherein a circuit for driving a motor is divided and divided sections of the circuit are formed on the first and second substrates;
a connecting part which connects the first and second substrates so that the first and second substrates intersect with each other;
a semiconductor device mounted on each of the first and second substrates;
a heat radiator having a first heat-transferring surface adjacent to the semiconductor device mounted on the first substrate and a second heat-transferring surface having a surface direction different from a surface direction of the first heat-transferring surface; and
a capacitor, wherein the capacitor is mounted on a capacitor substrate attached to a second conductive arm member extending from the first substrate.

4. The motor-drive unit as set forth in claim 1, wherein the capacitor is mounted on an extended portion formed by extending the second substrate in a direction perpendicular to the first substrate.

5. The motor-drive unit as set forth in claim 1, wherein the heat radiator has a plurality of heat-releasing fins extending parallel to each other at an inclined angle relative to the first heat-transferring surface and at an inclined angle relative to the second heat-transferring surface.

6. The motor-drive unit as set forth in claim 1, wherein the heat radiator has a plurality of heat-releasing fins including fins extending perpendicular to the first heat-transferring surface and including fins extending perpendicular to the second heat-transferring surface.

7. A motor-drive unit comprising:
a first substrate and a second substrate wherein a circuit for driving a motor is divided and divided sections of the circuit are formed on the first and second substrates;
a connecting part which connects the first and second substrates so that the first and second substrates intersect with each other;
a semiconductor device mounted on each of the first and second substrates;
a heat radiator having a first heat-transferring surface adjacent to the semiconductor device mounted on the first substrate; and
a capacitor positioned within a swept area formed by moving the first substrate in a direction perpendicular to the first heat-transferring surface, the capacitor being separated from the first substrate,
wherein a part of the heat radiator has a projecting portion extending in a direction perpendicular to the first heat-transferring surface, and the semiconductor device is attached to the projecting portion.

* * * * *